United States Patent [19]

Pasch et al.

[11] Patent Number: 5,689,134
[45] Date of Patent: Nov. 18, 1997

[54] INTEGRATED CIRCUIT STRUCTURE HAVING REDUCED CROSS-TALK AND METHOD OF MAKING SAME

[75] Inventors: Nicholas F. Pasch, Pacifica; Aldona M. Butkus, Santa Clara, both of Calif.

[73] Assignee: LSI Logic Corporation, Milpitas, Calif.

[21] Appl. No.: 685,772

[22] Filed: Jul. 24, 1996

Related U.S. Application Data

[63] Continuation of Ser. No. 370,492, Jan. 9, 1995, abandoned.

[51] Int. Cl.$^6$ .................... H01L 23/522; H01L 23/552
[52] U.S. Cl. .................... 257/659; 257/758; 257/786
[58] Field of Search .................... 257/659, 750, 257/754–760, 636, 646, 786, 207, 211

[56] References Cited

U.S. PATENT DOCUMENTS

| | | | |
|---|---|---|---|
| 4,622,576 | 11/1986 | Buynoski | 257/754 |
| 4,958,222 | 9/1990 | Takakura et al. | 257/659 |
| 4,984,200 | 1/1991 | Saitoo et al. | 257/659 |
| 5,060,045 | 10/1991 | Onada et al. | 257/211 |
| 5,262,353 | 11/1993 | Sun et al. | 257/759 |
| 5,300,814 | 4/1994 | Matsumoto et al. | 257/659 |
| 5,428,242 | 6/1995 | Furuya et al. | 257/659 |

FOREIGN PATENT DOCUMENTS

| | | | |
|---|---|---|---|
| 0004241 | 1/1985 | Japan | 257/659 |
| 0060255 | 3/1987 | Japan | 257/659 |
| 0299568 | 10/1992 | Japan | 257/659 |

*Primary Examiner*—Peter Toby Brown
*Attorney, Agent, or Firm*—John P. Taylor

[57] ABSTRACT

An integrated circuit structure is described having a non-metallic electrically conductive plate preferably placed over an insulating layer formed over the uppermost layer of metal lines. The electrically conductive non-metallic plate is operative to terminate electric field lines emanating from at least some of the metal lines in the metal layers under the insulating layer beneath the non-metallic electrically conductive plate, particularly the uppermost metal lines, i.e., those spaced the farthest distance from the underlying semiconductor substrate. The conductive plate may be connected to either a ground line or a power line. In another embodiment, the non-metallic electrically conductive plate may be located between at least the uppermost layer of metal lines and one or more lower layers of metal lines, with insulating layers separating the non-metallic electrically conductive plate from such metal lines.

6 Claims, 3 Drawing Sheets

5,689,134

INTEGRATED CIRCUIT STRUCTURE HAVING REDUCED CROSS-TALK AND METHOD OF MAKING SAME

This application is a continuation of U.S. patent application Ser. No. 08/370,492, filed Jan. 9, 1995 now abandoned.

BACKGROUND OF THE INVENTION

1. Field of the Invention

This invention relates to integrated circuit structures having multi-level metal layers, and more particularly to structure and method for reducing the cross-talk in such integrated circuit structures having multiple metal layers.

2. Description of the Related Art

In the formation of integrated circuit structures on a semiconductor wafer, it has become the practice to provide multiple layers of metal to provide metal interconnects or metal lines between the various electrodes of transistors and other active or passive devices comprising the integrated circuit structure. An example of such a multiple metal layer integrated circuit structure is shown in prior art FIG. 1 wherein an integrated circuit structure is generally shown at 10 comprising a semiconductor substrate 12 such as a single crystal silicon substrate having an MOS structure formed therein comprising source and drain regions 14 and 16, and a gate electrode 18 capable of activating a channel region 20 in substrate 12 between source region 14 and drain region 16. Field oxide potions 22 grown in substrate 12 provide isolation of the MOS structure from adjacent devices.

As shown in FIG. 1, an insulation layer 30, e.g., silicon oxide ($SiO_2$), is formed over the entire structure and contact openings are then cut through insulation layer 30 to provide electrical contact to the underlying electrodes, with contact opening 32a shown extending to source region 14 and contact opening 32b cut through insulation layer 30 to provide electrical contact to drain region 16. A contact opening (not shown) is also opened through insulation layer 30 to gate electrode 18. A first metal layer, e.g., aluminum or tungsten, is deposited over insulation layer 30 which also fills contact openings 32a and 32b. The metal layer is then patterned, forming metal interconnects or lines 40a and 40b shown in FIG. 1.

To provide a further layer of metal interconnects or lines, a second insulation layer 50 is then deposited over the structure, including metal interconnects 40a and 40b, and vias 52a and 52b are cut through insulation layer 50. A second metal layer is then deposited over insulation layer 50 and patterned to form second level metal interconnects 60a and 60b, with vias 52a and 52b also filled with metal as the metal layer is deposited. A final insulation layer 70 may then be formed over the entire structure or yet further levels of metal interconnects may be formed over insulation layer 70, with each such layer of metal interconnects separated from the underlying metal interconnects by a layer of insulation material with appropriate vias cut through the insulation layer to form the desired electrical connections between different levels of metal interconnects. The final layer of insulation, referred to as a "passivation" layer, is a layer of insulation which is typically somewhat thicker, e.g., about 1-2 micrometers (μm) or microns.

Recently, however, the thicknesses of the intermediate insulating layers have been increasing (to on the order of about 1-2 μm) in order to reduce the respective capacitances between the metal lines and thereby increase the speed at which the circuit can operate.

Such increased thicknesses of the insulating layers, however, has a penalty in increased intraline and interlayer capacitive cross-talk, as illustrated in FIG. 2. FIG. 2 shows an integrated circuit structure having three layers of metal lines, respectively formed over three insulation layers over the semiconductor substrate. Thus, a first insulating layer 80 has metal lines 82a–82d formed thereon, a second insulating layer 90 has metal lines 92a–92d formed thereon and a third insulating layer 100 has metal lines 102a–102d formed thereon. Other elements and devices of the integrated circuit structure, e.g., transistors and other active or passive devices to which the metal lines are connected, are not shown.

Metal lines 82a–82d, 92a–92d, and 102a–102d have corresponding electric field lines 86, 96, and 106 emanating therefrom. Ideally, the electric field lines 86, 96, and 106 should terminate in some large grounded body of the integrated circuit structure. While electric field lines 86 emanating from metal lines 82a–82d can satisfy this criteria by terminating in substrate 12, it is possible for some electric field lines to terminate in adjacent metal lines, as indicated by dotted lines 88.

However, because electric field lines 96 and 106 are relatively farther from substrate 12, their electric field lines cannot easily reach substrate 12 and, therefore, electric field lines 96 and 106 respectively terminate on previous metal lines 82a–82d and 92a–92d or on adjacent lines 92a–92d and 102a–102d. This is respectively known as interlayer and intraline capacitive cross-talk. Typically, the cross-talk emanating from the furthest metal lines, i.e., lines 102a–102d, is the strongest. As can be seen from FIG. 2, this problem is only exacerbated by increases in the thicknesses of the respective insulation layers 80, 90, and 100.

Such capacitive cross-talk can significantly impair the proper functioning of the integrated circuit. For example, if one of the metal lines in FIG. 2, e.g., line 102a, was connected between a driver (not shown) and a first transistor (also not shown), and an adjacent metal line on another level, e.g., line 92a, was connected to a second transistor (also not shown), a pulse signal propagating along line 102a and having a sharp transition from 5 volts to 0 volts would transition the first transistor in a normal way from 5 volts to 0 volts, e.g., turn the transistor on. However, due to capacitive coupling, a pulse would also be propagated in line 92a which, if the second transistor was already at 0 volts, could cause it to transition to a negative voltage value, typically of –0.7 volts, which is the latched state. Once the second transistor is at this latched state of –0.7 volts, it will not respond to incoming signals. It is, therefore, highly desirable to eliminate or mitigate such capacitive cross-talk between metal lines in an integrated circuit structure.

One approach which has been proposed to address this problem is the provision of a metal plate or layer between layers of metal lines, with the metal plate or layer then appropriately etched to permit connections between the metal lines respectively above and beneath the metal plate or layer. However, such additional masking and patterning of such a metal layer adds additional steps to the process which is undesirable.

It would, therefore, be desirable to eliminate or mitigate the problem of coupling between adjacent layers of metal lines or adjacent metal lines in the same layer without, however, requiring the placement and patterning of metal layers or plates between layers of metal lines of an integrated circuit structure.

SUMMARY OF THE INVENTION

It is, therefore, an object of the invention to reduce or eliminate the interlayer and intraline capacitive cross-talk between metal lines. There is, therefore, provided, in accordance with a preferred embodiment of the invention, an integrated circuit structure having a non-metallic, but electrically conductive, plate placed over an insulating layer formed over the uppermost layer of metal lines. The electrically conductive non-metallic plate is operative to terminate electric field lines emanating from at least some of the metal lines in the metal layers under the insulating layer beneath the non-metallic electrically conductive plate, particularly the uppermost metal lines, i.e., those spaced the farthest distance from the underlying semiconductor substrate. The conductive plate may be connected to either a ground line or a power line.

In another embodiment, a non-metallic electrically conductive plate may be located between at least the uppermost layer of metal lines and one or more lower layers of metal lines with insulating layers separating the non-metallic electrically conductive plate from such metal lines.

The invention further comprises a method of reducing cross-talk between metal lines of an integrated circuit structure which includes the step of placing a non-metallic electrically conductive plate over an insulating layer formed over the uppermost layer of metal lines. The method further includes connecting the non-metallic electrically conductive plate to either a ground line or a power line.

The method may further comprise placing the non-metallic electrically conductive plate between at least the uppermost layer of metal lines and one or more lower layers of metal lines with insulating layers separating the non-metallic electrically conductive plate from such metal lines.

DETAILED DESCRIPTION OF THE INVENTION

The invention comprises an integrated circuit structure having a non-metallic electrically conductive plate or layer formed adjacent and preferably over the uppermost layer of metal lines and capable of terminating electric field lines emanating from metal lines in the metal layer or layers adjacent the non-metallic electrically conductive plate.

The non-metallic electrically conductive plate preferably comprises polysilicon. It may also preferably comprise a metal silicide. When polysilicon is used in the formation of non-metallic electrically conductive plate, it may be undoped, but preferably will be at least slightly doped, e.g., with phosphorus or boron, to increase its conductivity. When a polysilicon layer is used as the non-metallic electrically conductive plate, it will usually be formed by CVD procedures such are well known to those skilled in the art. When a metal silicide is used it may be directly deposited over an insulation layer on the integrated circuit structure, e.g., by a CVD method or by a physical vapor deposition (PVD) such as by sputtering. The metal silicide may also be formed by first depositing a silicon layer, e.g., polysilicon, over an insulating surface of the integrated circuit structure and then depositing a layer of metal capable, upon subsequent heating, of reacting with the previously deposited silicon layer to form a metal silicide of the deposited metal. Examples of metals capable of reacting with silicon to form a metal silicide include titanium, tungsten, cobalt, tantalum, and niobium. Particularly preferred metals are titanium and tungsten, since these metals are also commonly used in the formation of other conductive portions of the integrated circuit structure such as metal lines, filling of vias, etc.

Figure 1:
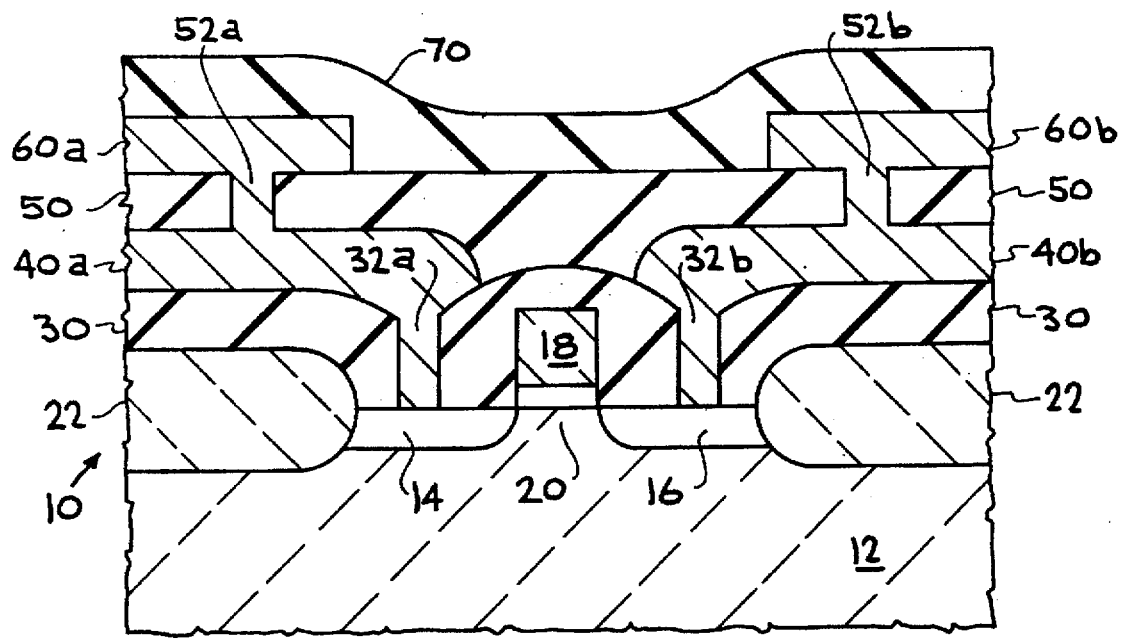
FIG. 1 is a fragmentary vertical cross-sectional view of a portion of a prior art integrated circuit structure having multiple layers of metal lines.
Figure 2:
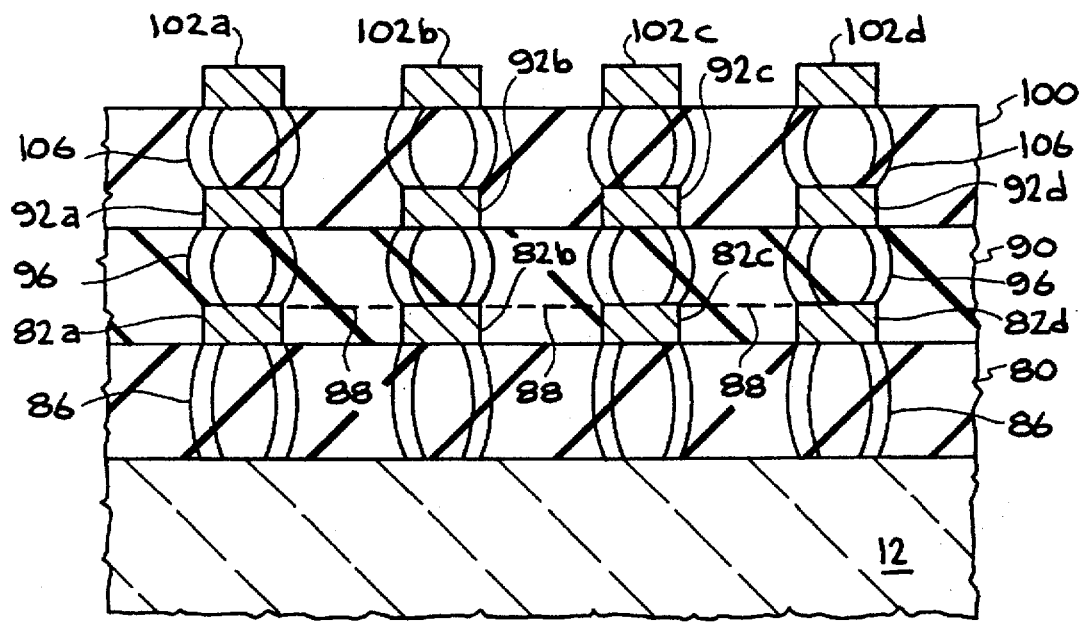
FIG. 2 is a fragmentary vertical cross-sectional view of a prior art integrated circuit structure having multiple layers of metal lines, schematically illustrating electric field lines emanating from the metal lines.
Figure 3:
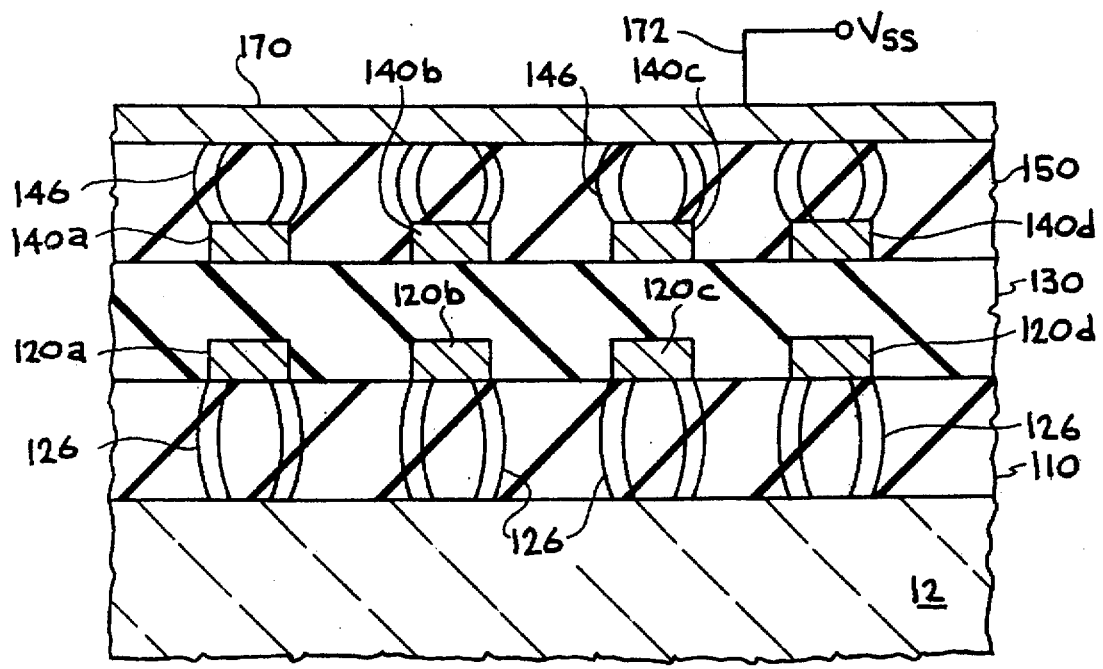
FIG. 3 is a fragmentary vertical cross-sectional view of an integrated circuit structure having multiple layers of metal lines and constructed, in accordance with the invention, with a non-metallic electrically conductive plate positioned over the insulation layer formed over the uppermost layer of metal lines, with the electric field lines emanating from the metal lines schematically illustrated.

Referring now to FIG. 3, an integrated circuit structure is shown comprising a semiconductor substrate 12 having a first insulation layer 110 formed thereon, for example of silicon oxide ($SiO_2$) or silicon nitride ($Si_3N_4$). Metal lines 120a–120d, formed, for example, by patterning an aluminum layer, are formed over insulation layer 110. A second insulation layer 130 is then formed over insulation layer 110 and metal lines 120a–120d, and a second set of metal lines 140a–140d is similarly formed over second insulation layer 130. A third insulation layer 150, which may also comprise a planarization layer, is then formed over second insulation layer 130 and metal lines 140a–140d. It will be understood, of course, that any of the just described insulation layers may be appropriately patterned or masked during formation as desired.

Figure 4:
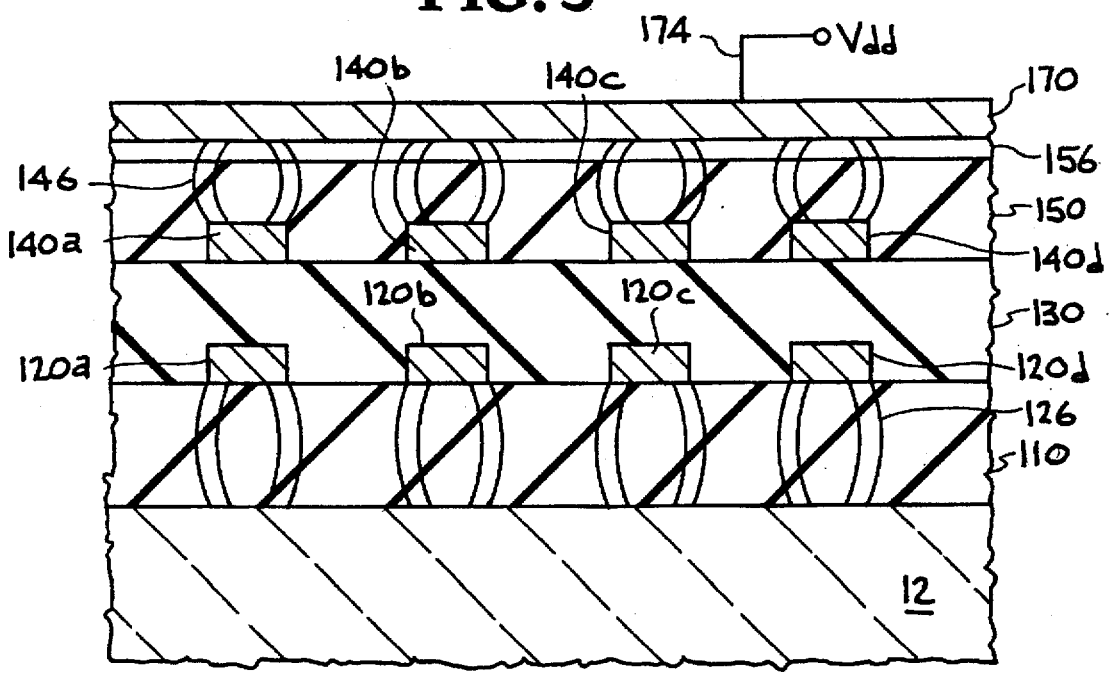
FIG. 4 is a fragmentary vertical cross-sectional view of another embodiment of the invention showing an integrated circuit structure having multiple layers of metal lines, as in FIG. 3, but with a passivation layer formed over the uppermost insulation layer and beneath the non-metallic electrically conductive plate.

In accordance with the invention, a layer or plate 170 of non-metallic electrically conductive material is then formed over third insulation layer 150 and then electrically connected to either ground or a power bus, e.g., connected by lead wire 172 to the Vcc (ground) line (as shown in FIG. 3) or by lead wire 174 to the Vdd (power) bus (as illustrated in FIG. 4). As discussed above, layer or plate 170 preferably comprises either doped or undoped polysilicon formed over insulation layer 150 by CVD procedures. If the polysilicon used in the formation of layer 170 is doped, such doping should be carried out prior to such an etching step, and preferably will be carried out during the deposition step. The structure may be heated, after doping, to activate the dopant, but care must be taken to not melt the already formed metal layers, e.g., metal lines. A typical heating step would comprise heating the structure to about 450° C. for about ½ hour or less.

As also mentioned above, layer or plate 170 may also comprise a metal silicide either deposited directly on the structure, e.g., by sputtering, or formed by first depositing a silicon layer such as polysilicon, and then depositing a layer of metal capable, upon subsequent heating, of reacting with the underlying silicon layer to form a metal silicide of the deposited metal.

The thickness of non-metallic electrically conductive plate 170 may range from about 3,000 Angstroms to about 10,000 Angstroms. The minimum thickness will be governed principally by the need to ensure formation of a continuous coating, and the need to form an electrical contact to layer or plate 170. The maximum thickness will be governed more by process economics, with thicker layers being useful, but usually deemed unnecessary.

As further shown in FIG. 3, the resulting field lines 126 emanating from lower level metal lines 120a–120d terminate in substrate 12 (as in the prior art), but unlike the prior art, field lines 146 emanating from upper metal lines 140a–140d now terminate in non-metallic electrically conductive plate 170. Thus, interlayer cross-talk between metal lines 120a–120d and 140a–140d has been reduced or eliminated. Furthermore, intraline cross-talk between adjacent upper metal lines on the same layer, e.g., between line 140a and 140b, may also be reduced or eliminated due to the proximity of conductive plate 170 to each of the upper level metal lines.

FIG. 4 shows a variation of this embodiment wherein a passivation layer 156 is provided beneath non-metallic electrically conductive plate or layer 170. Such a passivation layer, usually formed of silicon oxide ($SiO_2$), may be preferred when a non-oxide insulation layer 150 is utilized over upper metal lines 140a–140d and second insulation layer 130. For example, when third insulation layer 150 comprises silicon nitride, it may be preferred to form a thin (e.g., 100–200 Angstrom) oxide passivation layer over the silicon nitride prior to depositing a layer of polysilicon used to form non-metallic electrically conductive plate 170.

Figure 4A:
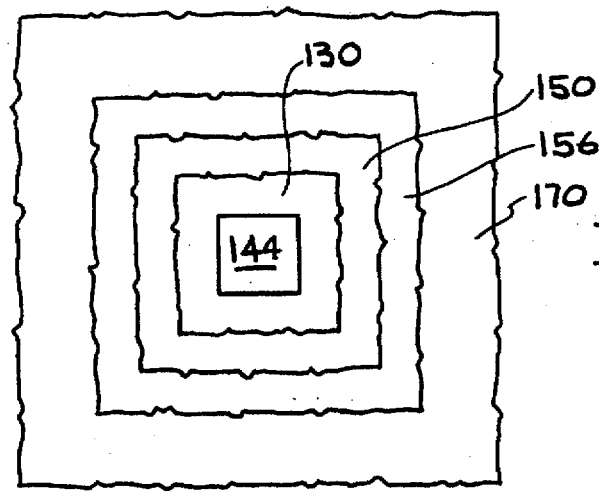
FIG. 4A is a fragmentary top view of the structure of FIG. 4 showing the etching back of the non-metallic electrically conductive plate and the passivation layer to provide access to a metal bond pad formed in the uppermost layer of metal lines.

It should be noted that openings may be provided, as needed, through plate 170 to provide electrical connection to underlying structures. FIG. 4A is a fragmentary top view which shows the etching of both plate 170 and the underlying insulation layers 150 and 156 to expose a metal contact plate 144 (not shown in FIG. 4) to permit an electrical connection to be made through such an opening in plate 170 down to one of metal lines 140a–140d beneath and electrically connected to metal contact 144.

Figure 5:
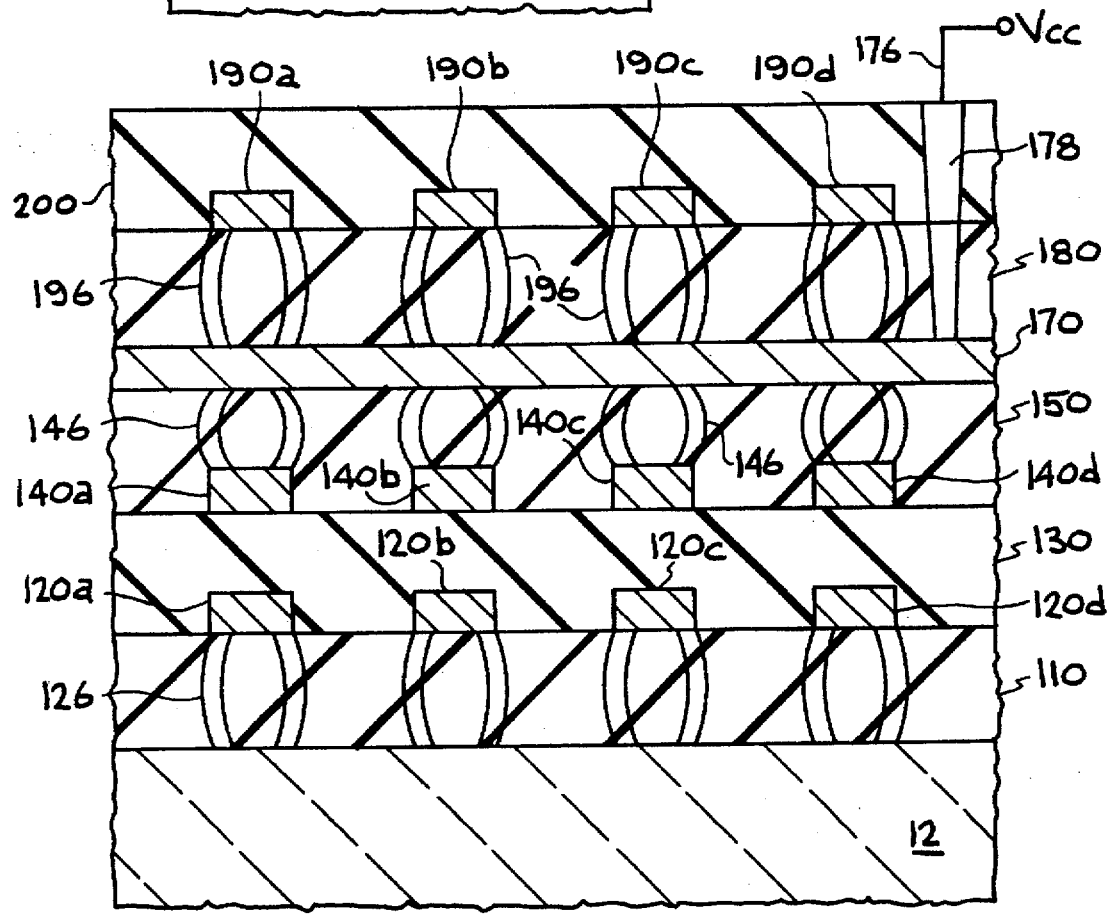
FIG. 5 is a fragmentary vertical cross-sectional view of yet another embodiment of the invention showing an integrated circuit structure having multiple layers of metal lines with a non-metallic electrically conductive plate positioned between insulating layers separating the uppermost layer of metal lines from the next lower layer of metal lines.

FIG. 5 illustrates yet another embodiment of the invention which may be of particular utility when more than two layers of metal lines are utilized in the construction of the integrated circuit structure. In this construction, wherein like structures with FIG. 3 are again illustrated with like numerals, a fourth insulation layer 180 is formed over non-metallic electrically conductive plate 170, and a third layer of metal lines 190a–190d is then formed over insulation layer 180. A final or planarization layer of insulation 200 is then shown formed over metal lines 190a–190d and fourth insulation layer 180. In this instance, a via 178 is shown formed through insulation layers 180 and 200 to permit electrical contact to be established between non-metallic electrically conductive plate 170 and a Vcc (ground) bus or Vdd (power) bus through lead 176 shown in FIG. 5 as connected between via 178 and a Vcc (ground) bus.

In this embodiment, the respective electrical field lines generated by both the second layer of metal lines 140a–140d and the third layer of metal lines 190a–190d can be terminated in non-metallic electrically conductive plate 170, instead of in adjacent metal lines, either on the same layer or on adjacent layers. Thus elimination or mitigation of both interlayer and intraline cross-talk between metal lines on the integrated circuit structure can be accomplished. Furthermore, it will be appreciated that having such a non-metallic conductive plate positioned as illustrated between metal lines, with insulation layers respectively separating the non-metallic electrically conductive plate from the metal lines, is advantageous over the formation of such a plate using a metal layer since the etching of polysilicon is a well-known and robust process.

Thus, the invention provides a structure and method for reducing or eliminating capacitive cross-talk between metal interconnects or lines using a non-metallic, but electrically conductive, layer formed over one of the uppermost layers of metal lines or interconnects to thereby permit electric field lines from the metal lines in such an upper layer or layers of metal lines to terminate in the non-metallic electrically conductive plate, rather than in an adjacent line which would cause undesirable coupling therebetween.

It will be appreciated by those skilled in the art that the present invention is not limited to what has been particularly shown and described hereinabove. Rather the scope of the present invention is defined only by the scope of the claims which follow.

Having thus described the invention what is claimed is:

1. An integrated circuit structure comprising:

a) one or more first insulation portions formed over a semiconductor substrate;

b) a first metal layer comprising one or more first metal lines formed over said one or more of said first insulation portions;

c) one or more second insulation portions formed over said one or more first metal lines;

d) a second metal layer comprising one or more second metal lines formed over said one or more second insulation portions, without any intervening conductive shields between said first and second metal lines;

e) one or more third insulation portions formed over said one or more second metal lines;

f) a passivation layer formed over said one or more third insulation portions;

g) an electrically conductive plate selected from the group consisting of a metal silicide and polysilicon formed over said passivation layer and said one or more third insulation portions formed beneath said passivation layer and;

h) an electrical connector formed between said electrically conductive plate formed over said passivation layer and either a ground or power bus;

whereby said electrically conductive plate is insulatively spaced above said one or more first and second metal lines and is capable of terminating at least a portion of electrical field lines emanating from at least some of said one or more first and second metal lines beneath said passivation layer and said electrically conductive plate.

2. The integrated circuit structure of claim 1 wherein said electrically conductive plate comprises polysilicon.

3. The integrated circuit structure of claim 1 wherein said electrically conductive plate comprises a metal silicide selected from the group consisting of titanium silicide, tungsten silicide, cobalt silicide, tantalum silicide, and niobium silicide.

4. The integrated circuit structure of claim 1 wherein said passivation layer comprises an oxide of silicon.

5. A method of reducing cross-talk between metal lines of an integrated circuit structure, wherein said metal lines are formed in two or more metal layers, without any intervening conductive shields between said two or more metal layers, and said metal lines of each of said two or more metal layers are insulated by portions of one or more insulating layers from other metal lines, the method comprising the further steps of:

a) forming a passivation layer over all of said metal lines of said two or more metal layers and all of said portions of said one or more insulating layers;

b) forming an electrically conductive plate selected from the group consisting of a metal silicide and polysilicon over said passivation layer, all of said metal lines, and all of said portions of said one or more insulating layers;

c) terminating on said electrically conductive plate at least a portion of the electric field lines emanating from at least a portion of said metal lines by electrically connecting said electrically conductive plate to either a ground bus or a power bus;

whereby at least a portion of said electric field lines emanating from at least a portions of said metal lines terminate on said electrically conductive plate.

6. An integrated circuit structure comprising:

a) a first insulation layer formed over a semiconductor substrate;

b) one or more first metal lines formed over said first insulation layer;

c) a second insulation layer formed over said one or more first metal lines;

d) one or more second metal lines formed over said second insulation layer, without any intervening conductive shields between said first and second metal lines;

e) a third insulation layer formed over said one or more second metal lines;

f) an electrically conductive plate selected from the group consisting of a metal silicide and polysilicon formed over said third insulation layer over said one or more second metal lines; and f) an electrical connector formed between:

i) said electrically conductive plate formed over said third layer; and ii) either a ground or power bus;

whereby said electrically conductive plate is positioned above and insulatively spaced from both said one or more first metal lines and said one or more second metal lines and is capable of terminating at least a portion of electrical field lines emanating from at least said one or more second metal lines beneath said third insulation layer and beneath said electrically conductive plate.

* * * * *

UNITED STATES PATENT AND TRADEMARK OFFICE
CERTIFICATE OF CORRECTION

PATENT NO. : 5,689,134
DATED : November 18, 1997
INVENTOR(S) : Nicholas F. Pasch and Aldona M. Butkus It is certified that error appears in the above-indentified patent and that said Letters Patent is hereby corrected as shown below:

Col. 6, line 44, Claim 1, change "layer and;" to "layer; and".

Col. 7, line 18, Claim 5, change "portions" to "portion".

Signed and Sealed this

Nineteenth Day of January, 1999

Attest:

*Attesting Officer*

*Acting Commissioner of Patents and Trademarks*